United States Patent
Ma et al.

(10) Patent No.: US 10,358,738 B2
(45) Date of Patent: Jul. 23, 2019

(54) GAP FILL PROCESS STABILITY MONITORING OF AN ELECTROPLATING PROCESS USING A POTENTIAL-CONTROLLED EXIT STEP

(71) Applicant: Lam Research Corporation, Fremont, CA (US)

(72) Inventors: Quan Ma, Tigard, OR (US); Shantinath Ghongadi, Tigard, OR (US); Zhian He, Lake Oswego, OR (US); Bryan Pennington, Sherwood, OR (US); Tariq Majid, Wilsonville, OR (US); Jonathan David Reid, Sherwood, OR (US)

(73) Assignee: Lam Research Corporation, Fremont, CA (US)

( * ) Notice: Subject to any disclaimer, the term of this patent is extended or adjusted under 35 U.S.C. 154(b) by 191 days.

(21) Appl. No.: 15/269,628

(22) Filed: Sep. 19, 2016

(65) Prior Publication Data

US 2018/0080140 A1    Mar. 22, 2018

(51) Int. Cl.
| | |
|---|---|
| *C25D 17/00* | (2006.01) |
| *C25D 7/12* | (2006.01) |
| *C25D 21/12* | (2006.01) |
| *H01L 21/768* | (2006.01) |
| *C25D 5/18* | (2006.01) |
| *C25D 17/06* | (2006.01) |
| *C25D 17/10* | (2006.01) |

(52) U.S. Cl.
CPC .............. *C25D 21/12* (2013.01); *C25D 5/18* (2013.01); *C25D 7/123* (2013.01); *C25D 17/001* (2013.01); *H01L 21/76879* (2013.01); *C25D 17/06* (2013.01); *C25D 17/10* (2013.01)

(58) Field of Classification Search
CPC .............................. C25D 21/12; C25D 17/001
See application file for complete search history.

(56) References Cited

U.S. PATENT DOCUMENTS

| | | | | |
|---|---|---|---|---|
| 4,765,878 | A | * | 8/1988 | Komoto ................. C25D 21/12 204/211 |
| 6,126,798 | A | | 10/2000 | Reid et al. |
| 6,156,167 | A | | 12/2000 | Patton et al. |
| 6,551,483 | B1 | | 4/2003 | Mayer et al. |
| 6,569,299 | B1 | | 5/2003 | Reid et al. |
| 6,800,187 | B1 | | 10/2004 | Reid et al. |

(Continued)

*Primary Examiner* — Brian W Cohen
(74) *Attorney, Agent, or Firm* — Weaver Austin Villeneuve & Sampson LLP

(57) ABSTRACT

Various embodiments herein relate to methods and apparatus for electroplating metal on a substrate. In many cases, an electroplating process may be monitored to ensure that it is operating within a pre-defined processing window. This monitoring may involve application of a controlled potential between the substrate and a reference electrode after the electroplating process is substantially complete (e.g., after recessed features on the substrate are substantially filled). The current delivered to the substrate during application of the controlled potential is monitored, and a peak current is determined. This peak current, often referred to herein as the potential-controlled exit peak current, can be compared against an expected range to determine whether the electroplating process is operating as desired.

18 Claims, 9 Drawing Sheets

(56) References Cited

U.S. PATENT DOCUMENTS

| | | |
|---|---|---|
| 6,946,065 B1 | 9/2005 | Mayer et al. |
| 9,385,035 B2 | 7/2016 | Spurlin et al. |
| 2004/0016637 A1* | 1/2004 | Yang ........................ A23D 7/00 204/242 |
| 2007/0062818 A1* | 3/2007 | Daviot ..................... C25D 3/38 205/291 |

\* cited by examiner

GAP FILL PROCESS STABILITY MONITORING OF AN ELECTROPLATING PROCESS USING A POTENTIAL-CONTROLLED EXIT STEP

BACKGROUND

In integrated circuit manufacturing, a conductive material, such as copper, is often deposited by electroplating onto a conductive seed layer to fill one or more recessed features on the wafer substrate. Electroplating is a method of choice for depositing metal into the vias and trenches of the wafer during damascene processing, and is also used to fill Through-Silicon Vias (TSVs), which are relatively large vertical electrical connections used in 3D integrated circuits and 3D packages. Electroplating may also be used to fill through resist WLP structures.

SUMMARY

Certain embodiments herein relate to methods and apparatus for monitoring an electroplating process using a potential-controlled exit step. In various embodiments, a controlled potential may be applied between a substrate and a reference electrode for a period of time after the features on the substrate are substantially or fully filled, in many cases while the substrate is being removed from the electrolyte. The controlled potential may be a constant potential. While the controlled potential is applied to the substrate, a current delivered to the substrate is monitored and recorded. In particular, a peak current delivered to the substrate during application of the controlled potential may be recorded. In some cases, an average current delivered to the substrate during application of the controlled potential may also be recorded. The peak and average current during this time are sensitive to a number of factors including the condition of the various portions of the apparatus (e.g., cup, electrical contacts, etc.), the condition/composition of the electrolyte, and the condition of the substrate. Therefore, deviations in the peak and/or average current delivered to the substrate during the controlled potential step can indicate that the electroplating process has strayed from acceptable electroplating conditions. In some cases, a substrate may be flagged for inspection when the peak and/or average current delivered to the substrate during the controlled potential step is outside of an expected tolerance range. If the flagged substrate does not meet the relevant quality standards, it may be discarded. Certain other potentials may be monitored and recorded, as well. For instance, the potential between the substrate and the anode and/or the potential between the anode and the reference electrode may each be monitored and recorded. These potentials may provide further information that may be used to diagnose a problem in cases where the peak and/or average current is higher or lower than expected.

In one aspect of the embodiments herein, a method of monitoring an electroplating process is provided, the method including: (a) immersing the substrate in electrolyte, the substrate including recessed features; (b) electroplating metal into the recessed features on the substrate; (c) after the recessed features are substantially filled with metal, monitoring a current delivered to the substrate while applying a controlled potential between the substrate and a reference electrode positioned in the electrolyte; (d) determining a potential-controlled exit peak current that corresponds to a maximum value of the current delivered to the substrate during application of the controlled potential during (c); and (e) comparing the potential-controlled exit peak current to an expected range for the potential-controlled exit peak current. In certain embodiments, (c) occurs while the substrate is being removed from the electrolyte. The controlled potential applied to the substrate during (c) may be a constant potential.

In some embodiments, the method may further include: (f) in response to a determination that the potential-controlled exit peak current is outside of the expected range for the potential-controlled exit peak current, inspecting an apparatus used to electroplate on the substrate. In some such cases, inspecting the apparatus used to electroplate on the substrate includes inspecting a substrate holder and/or an anode. In these or other cases, the method may further include cleaning and/or replacing a substrate holder and/or anode in the apparatus used to electroplate on the substrate. In some implementations, the method may further include: (f) in response to a determination that the potential-controlled exit peak current is outside of the expected range for the potential-controlled exit peak current, either (i) analyzing the electrolyte, (ii) refreshing the electrolyte, or (iii) replacing the electrolyte. In other cases, the method may further include: (f) in response to a determination that the potential-controlled exit peak current is within the expected range for the potential-controlled exit peak current, providing a second substrate and electroplating on the second substrate.

In certain embodiments, during (c), the controlled potential may be applied between the substrate and the reference electrode for a duration between about 5-100 milliseconds. In these or other embodiments, during (c), the controlled potential applied between the substrate and the reference electrode may have a magnitude between about 5-500 millivolts.

The method may further include, during (a), applying a second controlled potential to the substrate, monitoring a current delivered to the substrate during application of the second controlled potential, determining a potential-controlled entry peak current that corresponds to a maximum value of the current delivered to the substrate during application of the second controlled potential during (a), and comparing the potential-controlled entry peak current to an expected range for the potential-controlled entry peak current. In these or other cases, the method may further include during (b) before the features are substantially filled, applying a second controlled potential to the substrate, monitoring a current delivered to the substrate during application of the second controlled potential, determining a potential-controlled probe peak current that corresponds to a maximum value of the current delivered to the substrate during application of the second controlled potential during (b), and comparing the potential-controlled probe peak current to an expected range for the potential-controlled probe peak current.

The electroplating process may occur in stages. In one example, electroplating in (b) includes at least a first stage and a second stage, where during the first stage, a first constant current is applied to the substrate, and during the second stage, a second constant current is applied to the substrate, the first current and second current being different from one another. The substrate may be provided with a seed layer having a sheet resistance between about 0.1-200 ohm/sq. In some cases, the method may further include monitoring a potential between the substrate and an anode during (a), (b), and/or (c). In these or other cases, the method may further include monitoring a potential between the reference electrode and an anode during (a), (b), and/or (c).

In certain implementations, immersing the substrate in (a) may include: (i) applying a second controlled potential between the substrate and the reference electrode and monitoring a current delivered to the substrate during application of the second controlled potential, (ii) when the current delivered to the substrate during application of the second controlled potential reaches a threshold current, ceasing application of the second controlled potential and applying a current to the substrate, where the current applied to the substrate during (ii) changes as the substrate is immersed to thereby provide a uniform current density to an immersed portion of the substrate.

In some embodiments, the method may further include determining a potential-controlled exit average current that corresponds to an average value of the current delivered to the substrate during application of the controlled potential during (c); and comparing the potential-controlled exit average current to an expected range for the potential-controlled exit average current.

In another aspect of the disclosed embodiments, an apparatus for electroplating on a substrate is provided, the apparatus including: an electroplating chamber; a substrate holder; an anode; a reference electrode; a power supply electrically connected to the substrate holder, the anode, and the reference electrode; and a controller including executable instructions for: (a) immersing the substrate in electrolyte; (b) electroplating metal into recessed features on the substrate; (c) after the recessed features are substantially filled with metal, monitoring a current delivered to the substrate while applying a controlled potential between the substrate and a reference electrode positioned in the electrolyte; (d) determining a potential-controlled exit peak current that corresponds to a maximum value of the current delivered to the substrate during application of the controlled potential during (c); and (e) comparing the potential-controlled exit peak current to an expected range for the potential-controlled exit peak current.

In various embodiments, (c) may occur while the substrate is being removed from the electrolyte. The controlled potential applied to the substrate during (c) may be a constant potential in certain cases.

These and other features will be described below with reference to the associated drawings.

DETAILED DESCRIPTION

Figure 1:
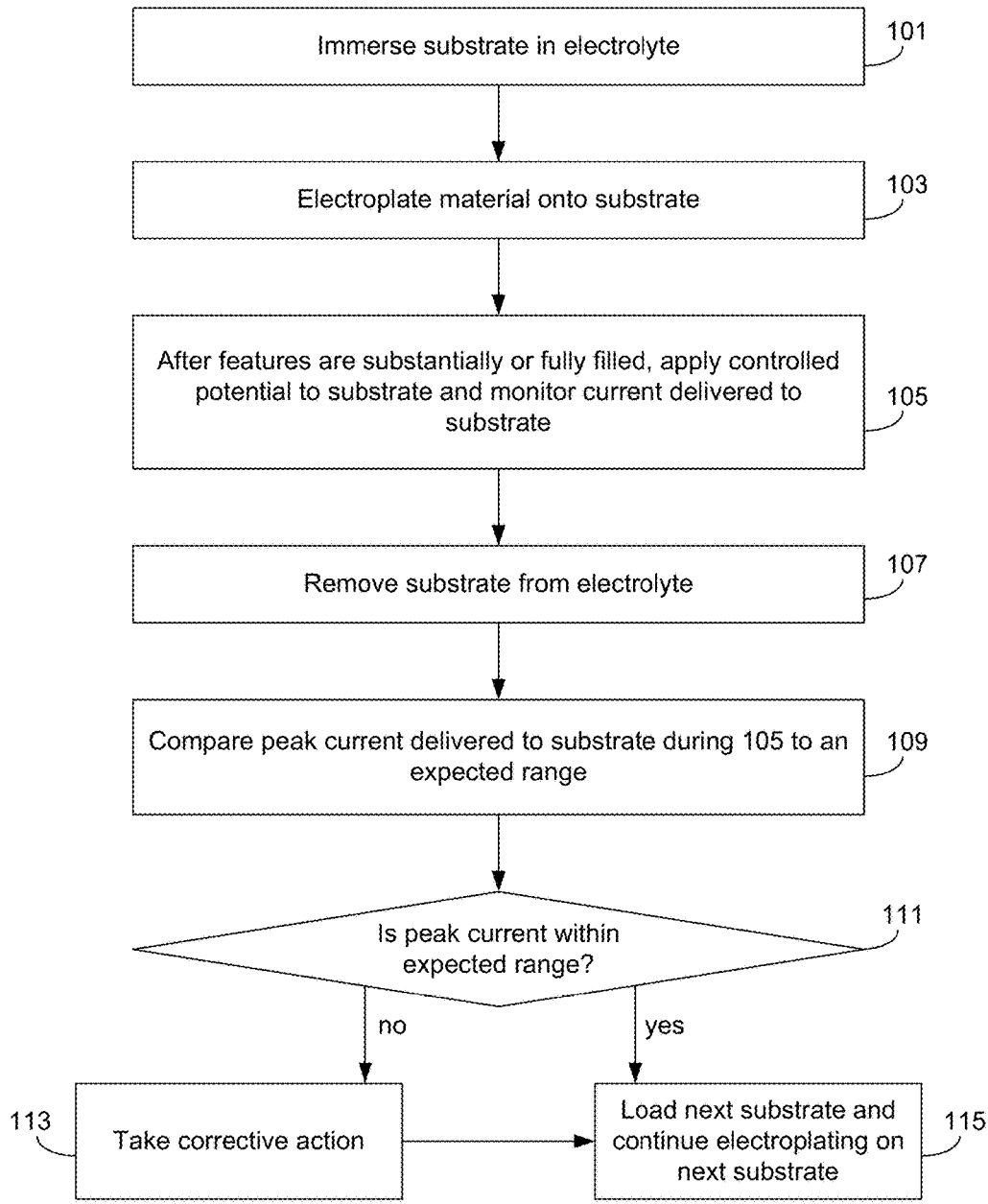
FIG. 1 illustrates a flow chart for a method of electroplating material on a substrate according to certain embodiments.

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 mm, or 300 mm, or 450 mm. Further, the terms "electrolyte," "plating bath," "bath," and "plating solution" are used interchangeably. The following detailed description assumes the embodiments are implemented on a wafer. However, the embodiments are not so limited. The work piece may be of various shapes, sizes, and materials. In addition to semiconductor wafers, other work pieces that may take advantage of the disclosed embodiments include various articles such as printed circuit boards, magnetic recording media, magnetic recording sensors, mirrors, optical elements, micro-mechanical devices and the like.

In the following description, numerous specific details are set forth in order to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Electrochemical deposition processes are commonly used for metalizing an integrated circuit. Such processes often involve depositing metal into trenches and vias that are pre-formed in dielectric layers. In various cases, a thin metal diffusion-barrier film may be deposited onto the surface of the substrate using physical vapor deposition (PVD) or chemical vapor deposition (CVD). On top of the metal diffusion-barrier film, a metal seed layer may be optionally deposited. In some cases, the metal seed layer isn't needed, and electroplating occurs directly on the metal diffusion-barrier film. When used, the metal seed layer is often copper, but may be other metals including, but not limited to, cobalt, ruthenium, aluminum, etc. The metal seed layer may also be an alloy of two or more metals. After deposition of the metal diffusion-barrier film and the optional seed layer, the features (e.g., vias and trenches) may be electrofilled with a desired fill material using an electrochemical deposition process.

The electrochemical deposition process, often referred to as an electroplating process, may be affected by a variety of factors and conditions. For instance, the composition of the electrolyte can have a significant impact on the electroplating behavior that will be achieved. In many cases, the electrolyte includes a variety of organic plating additives (e.g., accelerator, suppressor, leveler, brightener, etc.) that may be used to promote a desired fill behavior and/or film quality. Because certain additives may be consumed during electroplating, it is useful to monitor the plating process in a way that detects changes in the electrolyte composition.

Similarly, the plating process can be significantly affected by the condition of the electroplating apparatus. In some instances, a portion of the electroplating apparatus may become caked with material that may prevent the apparatus from functioning as desired. In one example, a layer of dried-on electrolyte or other undesired material may form on a substrate holder (often referred to as a cup). The electrolyte may dry onto the substrate holder as a result of failing to clean the substrate holder after use. In some cases, electrolyte may dry onto a substrate holder despite the fact that it was cleaned, which may indicate that the cleaning process was unsuccessful or incomplete. In some cases, electrolyte may dry onto a substrate holder before the substrate holder is due for cleaning, for example as a result of a compromised seal that permits electrolyte to contact the substrate holder in areas where such contact is not desired. Dirty or otherwise compromised substrate holders can affect the efficiency at which current/potential can be applied to the substrate during electroplating. The condition of the anode can similarly affect the electroplating behavior. As such, the condition of the apparatus has a substantial effect on the electroplating process.

Another factor that can affect an electroplating process is how the substrate is initially immersed into the electrolyte. A number of different immersion options are available. In many cases, the substrate is tilted from horizontal before it is immersed in electrolyte. This tilting can reduce the risk that bubbles will become trapped under the surface of the substrate. The substrate may also be rotated during immersion. The angle of immersion, rotation speed, and duration of immersion can all affect the electroplating process.

The way in which current and/or potential are applied to the substrate during immersion (as well as during the electroplating process) can also affect the electroplating results. In some cases, often referred to as "cold" entry cases, no current or potential are applied to the substrate while it is immersed. Instead, a current may be applied to the substrate only after the substrate is fully immersed in electrolyte. In some other cases, often referred to as "hot" entry cases, a constant current may be applied to the substrate during immersion. In hot entry cases, the leading edge of the substrate typically experiences a very high current density when it first contacts the electrolyte. This current density decreases as additional surface area of the substrate is immersed. In still other cases, often referred to as "potential-controlled" or "potentiostatic" entry cases, a constant potential (or non-constant but controlled potential) is applied between the substrate and a reference electrode as the substrate is immersed. As such, the newly immersed area of the substrate experiences a constant voltage during immersion. In these potential-controlled immersion cases, the current density delivered to the substrate is significantly more constant/uniform over the course of immersion, and over the face of the substrate, compared to other immersion techniques. Potential-controlled immersion methods provide significant benefits over hot entry and cold entry methods. Potential-controlled immersion methods are further described in U.S. Pat. Nos. 6,551,483 and 6,946,065, which are each herein incorporated by reference in their entireties. In some embodiments, the substrate may be immersed using a "potentiostatic triggered current ramping" technique. At an initial stage of immersion, a constant (or otherwise controlled) potential may be applied to the substrate. When the current delivered to the substrate reaches a threshold value, the controlled potential may be discontinued, and a current may be applied to the substrate. This current may ramp up from a lower initial current to a higher final current to provide a uniform current density over the face of the substrate over the course of immersion as additional substrate surface area is immersed in electrolyte. The switch between the potential-controlled and current ramping modes may occur relatively early in the immersion process, for example when the substrate is between about 2-10% immersed, as measured by surface area. Current ramping techniques are further discussed in U.S. Pat. No. 9,385,035, which is herein incorporated by reference in its entirety.

In cases where potential-controlled immersion is used, the stability of the electroplating process can be monitored by observing the peak current delivered to the substrate during the potential-controlled step during immersion. This peak current is sometimes referred to as the "potentiostatic entry peak current," and it can provide information about various plating conditions. A number of different factors may cause the peak current to stray outside of an expected tolerance range. For instance, in cases where the substrate holder is undesirably caked with dried on electrolyte, the potentiostatic entry peak current may be lower than expected due to the increased resistance of the substrate holder and the decreased efficiency at which current is delivered to the substrate. Similarly, in cases where the electrolyte has strayed from a desired composition (e.g., due to consumption or degradation of organic plating additives), the potentiostatic entry peak current may be higher or lower than expected. Other types of electroplating problems can similarly cause the potentiostatic entry peak current to stray from an expected tolerance range.

With the adoption of potentiostatic triggered current ramping immersion techniques, the ability to monitor the peak current experienced during immersion is effectively lost. While these methods do involve an initial stage at which potentiostatic conditions are applied, such conditions are typically applied for only a short time, and are followed by ramping current conditions. As such, in potentiostatic triggered current ramping entry cases, the "peak current" experienced during immersion is not particularly useful in terms of providing relevant information about the electroplating conditions. Therefore, although potentiostatic triggered current ramping immersion techniques are beneficial in terms of achieving a very uniform current density over the face of the substrate and over the course of immersion, such techniques compromise the ability to monitor the electroplating conditions over the course of several substrates. Such monitoring can be useful for ensuring that an electroplating apparatus is operating as desired, and can minimize the number of wafers that are processed in undesirable conditions (e.g., by identifying when a problem has occurred such that action can be taken before additional wafers are processed under relatively poor plating conditions). In order to effectively monitor an electroplating process, new methods are needed.

In various embodiments herein, a controlled potential (sometimes a constant potential) is applied to the substrate for a short time period after the electroplating process is substantially complete, while the substrate is being removed from electrolyte (or just before the substrate is removed from electrolyte). This stage of electroplating may be referred to as a potential-controlled exit stage. During the potential-controlled exit stage, the current delivered to the substrate is monitored and recorded. In particular, the peak current delivered to the substrate during the potential-controlled exit stage is recorded. This peak current is sometimes referred to as the "potentiostatic exit peak current," or the "potential-controlled exit peak current," and it provides significant information about whether the electroplating process is operating within a desired process window. Like the peak current experienced during a potential-controlled (e.g., potentiostatic) immersion stage, the peak current experienced during a potential-controlled exit stage is sensitive to a number of factors that affect the quality of the electroplating process. For instance, the potential-controlled exit peak current is sensitive to changes in electrolyte composition and to changes in the condition of the electroplating apparatus, as discussed further below. Therefore, by monitoring the potential-controlled exit peak current, problems that arise with the electroplating process can be flagged and addressed before additional substrates are processed in sub-par electroplating conditions. Alternatively or in addition, the average current delivered to the substrate during the potential-controlled exit stage may be recorded, and this current may be referred to as the "potentiostatic exit average current" or the "potential-controlled exit average current." The average current delivered to the substrate during this time may likewise provide information about whether the electroplating process is occurring as expected. Generally speaking, any of the methods described herein that involve monitoring a "peak" current can, alternatively or in addition, involve monitoring the average current delivered to the substrate during the relevant timeframe (e.g., during application of a controlled potential). The average current may provide a more stable value over several substrates, compared to the peak current. As such, it may be preferable in some embodiments to measure the average current in addition to (or even instead of, in certain cases) the peak current.

FIG. 1 provides a flowchart describing a method of electroplating according to one embodiment. The method begins with operation 101, where a substrate is immersed in electrolyte. The substrate may include a plurality of recessed features (e.g., vias, trenches, etc.) thereon, which may be lined with a seed layer. Any number of different electrolyte compositions may be used, as desired for a particular application. In some embodiments, the electrolyte may have a composition and/or properties as shown in Table 1.

TABLE 1

| Property | Value |
| --- | --- |
| Metal ion concentration | 0.5-40 g/l |
| Accelerator concentration | 1-10 ml/l |
| Suppressor concentration | 1-10 ml/l |
| Leveler concentration | 1-10 ml/l |
| Halide ion concentration | 30-200 ppm |
| pH | 0-5 |
| Temperature | 12 to 35° C. |
| Conductivity | 3-70 mS/cm |

As noted above, numerous options are available for immersing the substrate. In various embodiments, the substrate may be tilted from horizontal during immersion to reduce the likelihood that bubbles will become trapped under the plating surface of the substrate. The substrate may be rotated during immersion in some cases. The substrate may experience cold entry conditions, hot entry conditions, potentiostatic entry conditions, or potentiostatic triggered current ramping conditions, as described above. Although the potential-controlled exit monitoring techniques described herein are especially useful in cases where potentiostatic triggered current ramping conditions are used during immersion, such techniques are useful/beneficial regardless of the immersion method that is used.

In cases where hot entry conditions are used, the potential applied to the substrate before and/or during immersion may be a slightly cathodic potential. This refers to the potential applied to the substrate with respect to a reference electrode positioned in the electrolyte. The cathodic potential may be a constant cathodic DC voltage having a value between about −5 millivolts to about −100 millivolts, for example about −10 millivolts in some cases. Alternatively, the cathodic potential may be a pulsed, cathodic voltage having a value between about −10 millivolts and about −500 millivolts, having a waveform period from about 0.1 milliseconds to about 10 milliseconds, and a duty cycle from about 1% to about 50%. The potential may be applied to the substrate for a duration between about 0-5 seconds. Further details related to hot entry methods are discussed in U.S. Pat. Nos. 6,551,483 and 6,946,065, which are incorporated by reference above.

In cases where potentiostatic triggered current ramping conditions are used, there are at least two stages during immersion. During the first stage, a constant (or otherwise controlled) potential is applied between the substrate and the reference electrode in the electrolyte. This potential may be applied until the substrate is between about 1-10% immersed (as calculated by surface area). The potential may be a slightly cathodic potential. The potential may be a constant cathodic DC voltage having a value between about −5 millivolts to about −100 millivolts, for example about −10 millivolts in some cases. In some cases, the potential may be a pulsed, cathodic voltage having a value between about −10 millivolts and about −500 millivolts, having a waveform period from about 0.1 milliseconds to about 10 milliseconds, and a duty cycle from about 1% to about 50%. The current delivered to the substrate is monitored during this constant (or otherwise controlled) potential stage. When the current delivered to the substrate reaches a threshold value, the applied potential between the substrate and the reference electrode is discontinued, and a current is applied to the substrate. This threshold current value may be between about 0.1-10 Amps. The current applied to the substrate starts at a relatively low value, e.g., between about 0.1-1 Amps, and rises until reaching a higher value, e.g., between about 1-10 Amps. The current may rise continuously or in steps. Generally, the current may increase in a way that provides a substantially constant current density on the immersed portion of the substrate. For instance, the current may rise relatively quickly when the substrate is about half immersed (when the amount of immersed substrate area is changing most dramatically), and may rise relatively more slowly when the substrate is nearly entirely immersed (when the amount of immersed surface area is not changing as dramatically). The current ramping stage of the potentiostatic triggered current ramping technique may continue until the substrate is completely immersed. Further details related to current ramping techniques are discussed in U.S. Pat. No. 9,385,035, which is incorporated by reference above.

After the substrate is immersed in electrolyte, the method continues with operation 103 where material is electroplated onto the substrate. In various embodiments, this may involve applying current to the substrate to cause material to electroplate onto the surface of the substrate. Any current profile may be used. In some embodiments, operation 103 may occur in stages, with a different (optionally constant) current applied to the substrate at each stage. In one example, operation 103 involves (1) a first stage during which no current or a low-level constant current (e.g., at a current density between about 1-10 mA/cm$^2$) is applied to the substrate, (2) a second stage during which a medium-level constant current (e.g., at a current density between about 5-15 mA/cm$^2$) is applied to the substrate, and (3) a third stage during which a high-level constant current (e.g., at a current density between about 10-30 mA/cm$^2$) is applied to the substrate. The first and second stages may correspond to a period during which many or all of the features on the substrate are filled (e.g., bottom-up gap fill in many cases), while the third stage may correspond to an overburden period that occurs after the features are filled, when material is being plated in the field region of the substrate.

The method continues with operation 105, where a controlled potential (sometimes a constant potential) is applied to the substrate for a short duration. This potential refers to the potential between the substrate and the reference electrode. In some cases, the duration of the applied controlled potential during operation 105 may be between about 5-100 milliseconds, or between about 10-30 milliseconds, for example about 20 milliseconds. The controlled potential is typically applied to the substrate for a relatively short time such that this probing step (operation 105) does not substantially affect the electroplated film or cause substantial unwanted plating. The magnitude and direction of the potential may also be chosen to prevent substantial unwanted plating (or deplating). The potential that is applied to the substrate may be a constant cathodic DC potential, with a value between about −5 and −100 millivolts, or between about −5 and −20 millivolts, in some cases about −10 millivolts. In some cases, the potential may be a pulsed, cathodic voltage having a value between about −10 millivolts and about −500 millivolts, having a waveform period from about 0.1 milliseconds to about 10 milliseconds, and a duty cycle from about 1% to about 50%. While the controlled potential is applied to the substrate, the current delivered to the substrate is monitored and recorded. From this data, the potential-controlled exit peak current can be determined. This value corresponds to the highest level of current delivered to the substrate during the application of controlled potential during operation 105. In this example, the controlled potential is a constant potential, and the potential-controlled exit peak current is often referred to as the potentiostatic exit peak current.

In some cases, the potential-controlled exit average current is determined, corresponding to the average level of current delivered to the substrate during application of controlled potential during operation 105. This potential-controlled exit average current may be monitored instead of, or in addition to, the potential-controlled exit peak current.

Operation 105 typically begins after the features on the substrate are substantially (e.g., at least about 80%) or fully filled. In some cases, operation 105 may begin at the same time that the substrate starts moving upwards to be removed from electrolyte. In other cases, operation 105 may begin after the substrate starts moving upwards to be removed from electrolyte. In still other cases, operation 105 may begin before the substrate starts moving upwards to be removed from electrolyte. Operation 105 may end before any portion of the plating face of the substrate is removed from electrolyte (in some such cases, operation 105 may be performed while the substrate is being vertically lifted, while the plating face is still immersed). In other cases, operation 105 may end at a time when the substrate is partially removed from the electrolyte. In still other cases, operation 105 may end at a time when the substrate is completely removed from the electrolyte (e.g., the controlled applied potential is maintained between the substrate and the reference electrode until the substrate is completely removed from electrolyte). In operation 107, the substrate is removed from electrolyte. Operations 105 and 107 may overlap in time, as discussed above. In certain cases, operation 107 may have a duration between about 0.05-5 seconds, or between about 0.2-1 second. While the peak current recorded during operation 105 is often referred to as the potentiostatic or potential-controlled exit peak current, it is understood that this peak current does not necessarily have to occur while the substrate is actively exiting the electrolyte. Rather, the potentiostatic or potential-controlled exit peak current is the peak current delivered to the substrate during operation 105 (which occurs after the features on the substrate are substantially or fully filled with electroplated material from operation 103).

At operation 109, the potentiostatic exit peak current is compared to an expected range. The expected range for the potentiostatic exit peak current may be determined empirically. The expected range for the potentiostatic exit peak current will depend on a number of factors including, but not limited to, the composition of the electrolyte, the current waveform that is used to plate, the thickness, composition, and resistance of an incoming seed layer, and the apparatus that is used to plate. The span of the expected range (e.g., the difference between the lowest and highest expected potentiostatic exit peak currents) will determine how sensitive the monitoring process is. Shorter spans provide greater sensitivity compared to longer spans. In one example, the potentiostatic exit peak current may have an expected range that centers around 8 A. Where a relatively longer span (4 A) is used, the expected range of the potentiostatic exit peak current may be between about 6-10 A. Where a relatively shorter span (1 A) is used, the expected range of the potentiostatic exit peak current may be between about 7.5-8.5 A. The expected range can be tailored as desired for a particular application and tolerance level.

In some cases, operations 109 and 111 may involve comparing the average current delivered to the substrate during operation 105 (referred to as the potential-controlled exit average current) to an expected range for this value. This potential-controlled exit average current may be determined and used in addition to, or instead of, the potential-controlled exit peak current, in various embodiments.

At operation 111, it is determined whether the potentiostatic exit peak current is within the expected range. If so, the method continues at operation 115 where the next substrate is loaded into the electroplating apparatus such that electroplating can continue on the next substrate. However, if it is determined that the potentiostatic exit peak current recorded during operation 105 is outside of the expected range, the substrate is flagged and the method continues at operation 113, where a corrective action is taken. The corrective action may relate to a number of different possibilities, and may or may not involve further metrology to diagnose what caused the potentiostatic exit peak current to stray from the expected range. In cases where further metrology is performed, such metrology may occur during any of the operations shown in FIG. 1.

In certain embodiments where the potential-controlled exit average current is determined, operation 111 may, alternatively or in addition, involve comparing the potential-controlled exit average current to an expected range for this value, as mentioned above. This average current may similarly provide information about whether the electroplating process is occurring as desired. In some cases, the method may continue with operation 115 (immediately after operation 111) only if both the potential-controlled exit peak current and the potential-controlled exit average current are within their respective expected ranges. In another embodiment, the method may continue with operation 115 (immediately after operation 111) only if the potential-controlled exit average current is within its expected range, regardless of the potential-controlled exit peak current. In another embodiment shown in FIG. 1, the method may continue with operation 115 (immediately after operation 111) only if the potential-controlled exit peak current is within its expected range, regardless of the potential-controlled exit average current.

In some embodiments, operation 113 may involve replacing or cleaning a portion of the electroplating apparatus. An inspection may be performed in some cases to determine if cleaning or replacement is warranted. In one example, the substrate holder is replaced or cleaned. In another example, the anode is replaced or cleaned. In certain embodiments, operation 113 may involve adjusting the composition of the electrolyte or replacing the electrolyte. In these or other embodiments, operation 113 may involve adjusting a previous processing step, such as a step performed to deposit a seed layer on the substrate. The adjustment may lead to a different thickness of the seed layer on subsequent substrates.

As mentioned, operation 113 may also involve certain metrology steps to isolate and identify the conditions that caused the potential-controlled exit peak current to stray from the expected range. In a number of embodiments, one or more potentials may be monitored throughout the electroplating process (or during a specific portion of the electroplating process). For example, the potential between the substrate and the anode, and/or the potential between the anode and the reference electrode, can each be monitored and recorded. These potentials can be compared against expected ranges, which may be determined empirically. The potentials can be compared during any one or more of the operations shown in FIG. 1. In one example, at least one of these potentials (e.g., between the substrate and anode, or between the anode and reference electrode) is monitored and recorded during operation 105 and/or 107. In these or other examples, at least one of these potentials is monitored and recorded during operation 101 and/or 103. Also, in cases where potentiostatic entry is used, the potentiostatic entry peak current may be used to aid in identifying any issues. The metrology may also relate to any metrology methods known in the art.

Figure 2:
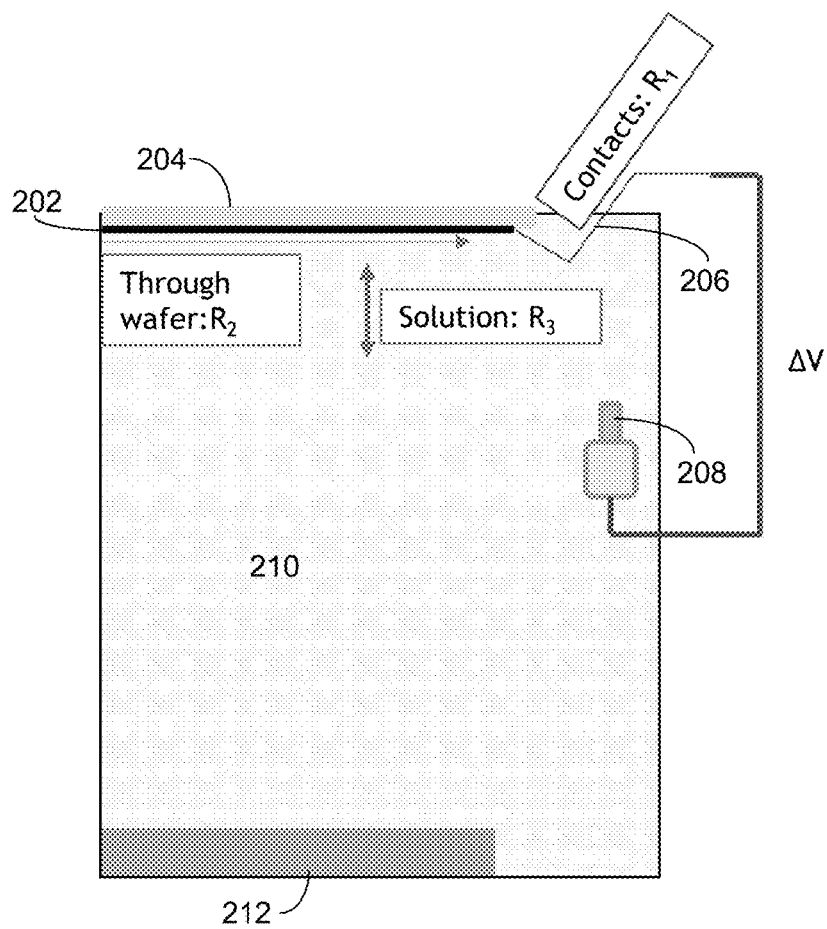
FIG. 2 depicts a portion of an electroplating apparatus that may be used to practice certain embodiments.

FIG. 2 provides a simplified view of a portion of an electroplating apparatus (only the right half of the apparatus is shown, and many apparatus features are omitted for the sake of clarity). The substrate 202 is positioned in a substrate support 204, where it is in contact with a plurality of electrical contacts 206 near the periphery of the substrate. A reference electrode 208 is positioned in the electrolyte 210. An anode 212 is also positioned in the electroplating apparatus. Three different resistances are illustrated in FIG. 2. $R_1$ refers to the resistance through the electrical contacts in the substrate support, $R_2$ refers to the resistance through the substrate, and $R_3$ refers to the resistance through the solution.

Each of these resistances can sometimes stray outside of an expected/acceptable range, which can deleteriously affect the electroplating process. For instance, the resistance of the electrical contacts, $R_1$, can increase in cases where a sealing member fails to adequately prevent exposure of the electrical contacts to the electrolyte. In such cases, electrolyte can leak into the area of the contacts, where it may form a layer of caked on material, which increases the resistance of the electrical contacts. This can negatively affect the plating process because the increased $R_1$ results in less efficient delivery of current to the substrate during electroplating. The resistance through the substrate, $R_2$, can vary depending on the thickness and composition of the seed layer (or other exposed layer if a seed layer isn't present). This resistance affects how efficiently and uniformly the current is applied to the substrate during electroplating. For instance, if the resistance $R_2$ of the seed layer is too high (e.g., as a result of a seed layer that is too thin), the substrate may have substantial center-to-edge differences in the plated film. The resistance through the solution, $R_3$, also affects the electroplating results, including the mechanism by which features are filled on the substrate. In order to achieve bottom-up fill, the resistance of the solution should be within an expected range such that the various species in the electrolyte are able to function together as desired.

By monitoring the different potentials and currents as described herein, the issue causing the potential-controlled peak exit current to stray from the expected range may be isolated/identified. For example, the potential between the reference electrode and the anode is dependent upon the condition of the electrolyte and the condition of the anode. This potential is independent of the conditions on the substrate and substrate holder. The potential between the substrate and the anode is dependent upon the condition of the electrolyte, the condition of the substrate (e.g., resistance of the seed layer), and the condition of the anode. By looking at the various potentials and peak (and/or average) currents described herein, the problem can be isolated to a specific portion of the electroplating process. Generally speaking, information related to the peak current over a specific timeframe may also apply to the average current over that timeframe.

In one example where the electrical contacts in the substrate holder are dirty (e.g., with dried-on electrolyte or another unwanted material), this issue can be diagnosed by analyzing (1) the potential-controlled exit peak current and (2) the potential between the reference electrode and the anode, and optionally the potential between the substrate and the anode. The potential-controlled exit peak current may be outside of the expected range, indicating that there is likely a problem. The potential between the reference electrode and the anode is likely to remain within its expected range in cases where the substrate holder is dirty, because this potential is independent of the conditions on the substrate holder. Thus, in cases where the potentiostatic exit peak current is out of its expected range and the potential between the reference electrode and anode is within its expected range, it can be determined that the problem is likely associated with the substrate or substrate holder. From this same information, it can be determined that the problem is not likely associated with the condition/composition of the electrolyte, nor with the condition of the anode, as these problems would likely cause the potential between the reference electrode and anode to stray from its expected range. This determination can be further confirmed by analyzing the potential between the substrate and the anode. In cases where the substrate holder is dirty, the potential between the substrate and anode will likely be outside of its expected range.

In another example the seed layer deposited on the substrate is out of specification (e.g., too thin, too thick, or the wrong material). In this example, the potential-controlled peak exit current would likely be outside of its expected range, indicating that there is a problem. The potential between the substrate and the anode would also likely be outside of its expected range, but the potential between the reference electrode and the anode would likely remain within its expected range.

Issues related to the condition of the substrate (e.g., seed layer) or the condition of the substrate support will typically exhibit similar symptoms in terms of current/potentials. In order to determine whether the issue is related to the substrate vs. the substrate support, a visual inspection (or other metrology) of the plated substrate or the substrate holder may be performed. Problems associated with the substrate/seed layer may lead to significant center-to-edge non-uniformities in the plated film, which can be observed by inspecting the substrate. Problems associated with a dirty or otherwise poor condition substrate support may be observed by inspecting the substrate support.

In another example the electrolyte is out of specification. The electrolyte may have a composition that has strayed from an expected composition range. This change in composition may lead to a change in the conductivity/resistivity of the electrolyte. In this example, the potential-controlled peak exit current would likely be outside of its expected range, indicating that there is a problem. The potential between the substrate and the anode would also likely be outside of its expected range, as would the potential between the reference electrode and the anode. When each of these metrics is outside of its expected range, it may indicate that the electrolyte should be analyzed, treated to tailor its composition, refreshed (e.g., by replacing a portion of the electrolyte), and/or replaced.

In another example the anode is in poor condition (e.g., coated with anode sludge, degraded, etc.). Here, the potential-controlled peak exit current is likely to be outside of its expected range. The potential between the substrate and the anode is also likely to be outside of its expected range, as is the potential between the reference electrode and the anode. When each of these metrics is outside of its expected range, it may indicate that the anode should be inspected, cleaned, and/or replaced.

Problems associated with the condition/composition of the electrolyte or the condition of the anode may exhibit similar symptoms in terms of current/potentials. To determine whether the problem is associated with the electrolyte or with the anode, a number of options are available. For instance, the anode may be visually inspected or otherwise analyzed. In some cases, the electrolyte may undergo further testing to evaluate its composition and/or properties.

Figure 3:
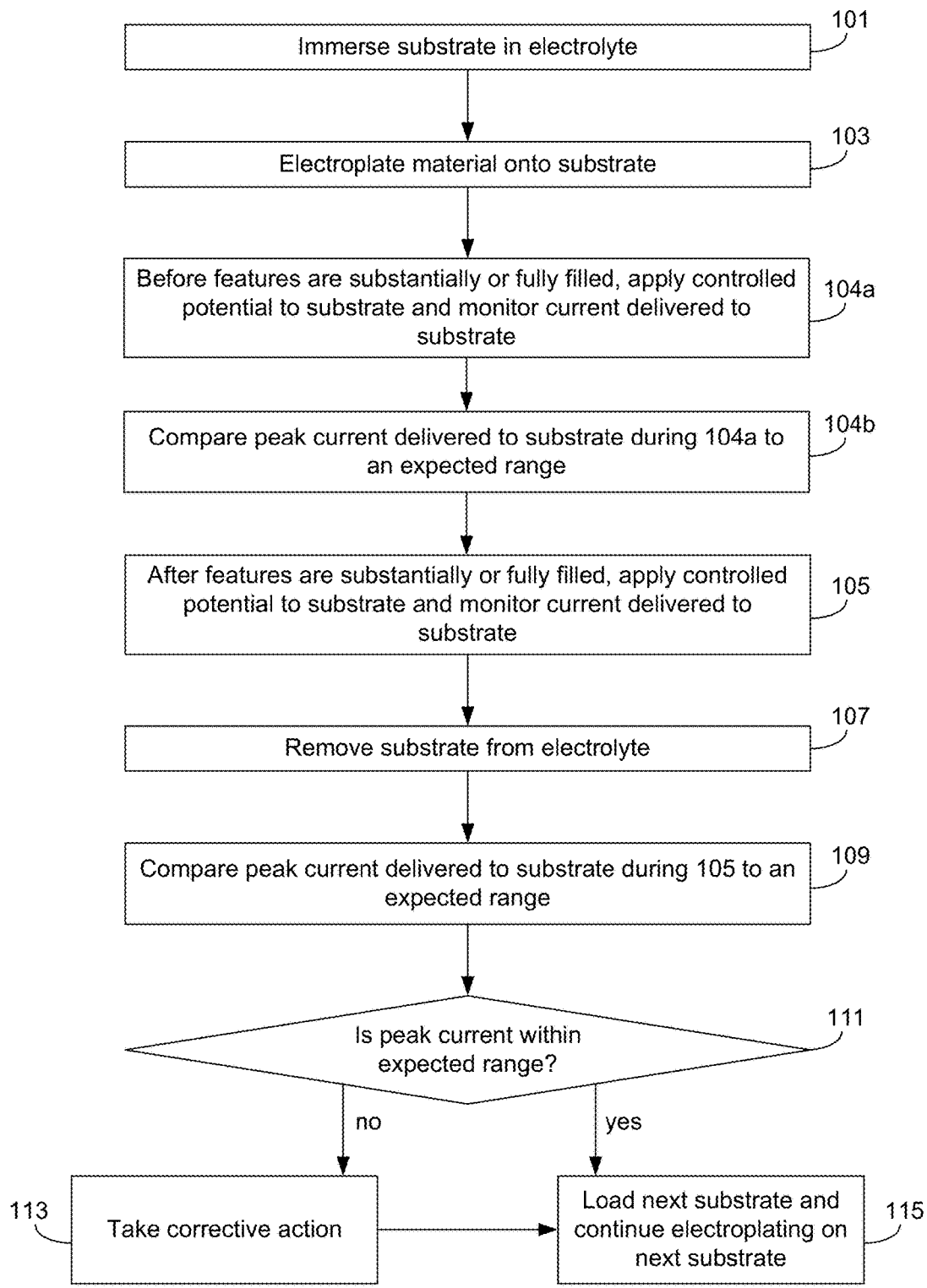
FIG. 3 shows a flow chart for a method of electroplating material on a substrate according to a particular embodiment.

FIG. 3 presents a flowchart for a method of electroplating according to certain embodiments. The method in FIG. 3 is similar to the method in FIG. 1, and for the sake of brevity only the differences will be described. The method in FIG. 3 includes additional operations 104a and 104b. In operation 104a, a controlled potential is applied to the substrate while a current delivered to the substrate is monitored and recorded. This operation may be referred to as a "potential-controlled probe" step, and it occurs before the features on the substrate are substantially or fully filled. For example, operation 104a may occur during operation 101 and/or during operation 103. Generally, operation 104a may be similar to operation 105, except for the timing of when these steps occur. As such, description herein related to the potential-controlled exit step (operation 105) may also apply to the potential-controlled probe step (operation 104a).

In operation 104b, the peak current delivered to the substrate during operation 104a (also referred to as the potential-controlled probe peak current) is compared against an expected range. Like the peak current delivered to the substrate during operation 105, the potential-controlled probe peak current can provide information about whether the electroplating process is operating within a pre-defined processing window. The potential-controlled probe peak current may stray out of its expected range as a result of various issues as described herein, including but not limited to, dirty or degraded apparatus parts (e.g., substrate holder, electrical contacts, anode, etc.), electrolyte that is out-of-specification, or a different seed layer thickness/resistance. In some cases, operation 104b may involve comparing the average current delivered to the substrate during operation 104a (either instead of, or in addition to, the peak current during this same time) to an expected range for this value.

Apparatus

The methods described herein may be performed by any suitable apparatus. A suitable apparatus includes hardware for accomplishing the process operations and a system controller having instructions for controlling process operations in accordance with the present embodiments. For example, in some embodiments, the hardware may include one or more process stations included in a process tool.

Figure 4:
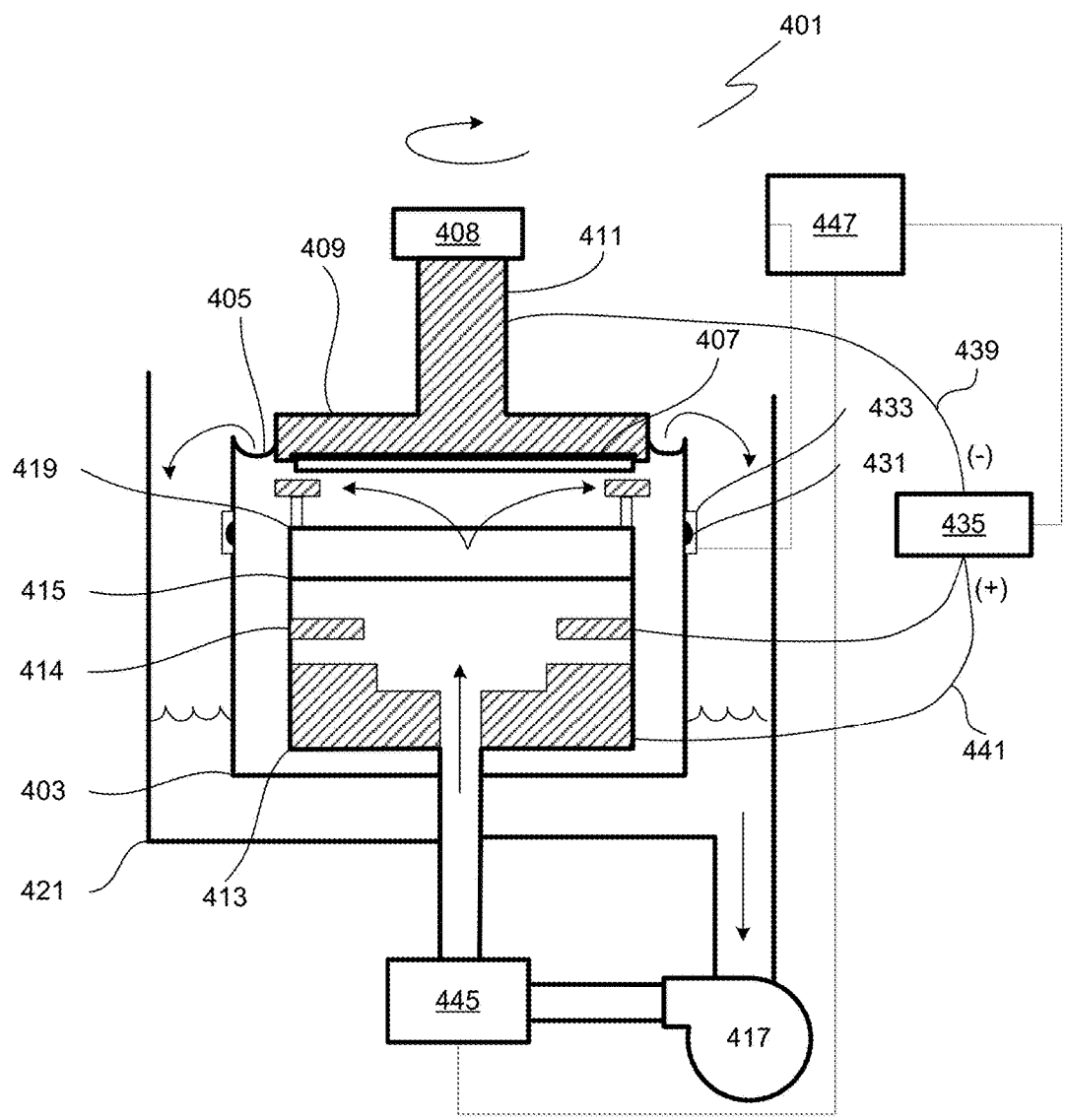
FIG. 4 presents a view of an electroplating apparatus according to certain embodiments.

FIG. 4 presents an example of an electroplating cell in which electroplating may occur. Often, an electroplating apparatus includes one or more electroplating cells in which the substrates (e.g., wafers) are processed. Only one electroplating cell is shown in FIG. 4 to preserve clarity. To optimize bottom-up electroplating, additives (e.g., accelerators, suppressors, and levelers) are added to the electrolyte; however, an electrolyte with additives may react with the anode in undesirable ways. Therefore anodic and cathodic regions of the plating cell are sometimes separated by a membrane so that plating solutions of different composition may be used in each region. Plating solution in the cathodic region is called catholyte; and in the anodic region, anolyte. A number of engineering designs can be used in order to introduce anolyte and catholyte into the plating apparatus.

Referring to FIG. 4, a diagrammatical cross-sectional view of an electroplating apparatus 401 in accordance with one embodiment is shown. The plating bath 403 contains the plating solution (having a composition as provided herein), which is shown at a level 405. The catholyte portion of this vessel is adapted for receiving substrates in a catholyte. A wafer 407 is immersed into the plating solution and is held by, e.g., a "clamshell" substrate holder 409, mounted on a rotatable spindle 411, which allows rotation of clamshell substrate holder 409 together with the wafer 407. A general description of a clamshell-type plating apparatus having aspects suitable for use with this invention is described in detail in U.S. Pat. No. 6,156,167 issued to Patton et al., and U.S. Pat. No. 6,800,187 issued to Reid et al., which are incorporated herein by reference in their entireties.

An anode 413 is disposed below the wafer within the plating bath 403 and is separated from the wafer region by a membrane 415, preferably an ion selective membrane. For example, Nafion™ cationic exchange membrane (CEM) may be used. The region below the anodic membrane is often referred to as an "anode chamber." The ion-selective anode membrane 415 allows ionic communication between the anodic and cathodic regions of the plating cell, while preventing the particles generated at the anode from entering the proximity of the wafer and contaminating it. The anode membrane is also useful in redistributing current flow during the plating process and thereby improving the plating uniformity. Detailed descriptions of suitable anodic membranes are provided in U.S. Pat. Nos. 6,126,798 and 6,569,299 issued to Reid et al., both incorporated herein by reference in their entireties. Ion exchange membranes, such as cationic exchange membranes, are especially suitable for these applications. These membranes are typically made of ionomeric materials, such as perfluorinated co-polymers containing sulfonic groups (e.g. Nafion™), sulfonated polyimides, and other materials known to those of skill in the art to be suitable for cation exchange. Selected examples of suitable Nafion™ membranes include N324 and N424 membranes available from Dupont de Nemours Co.

During plating the ions from the plating solution are deposited on the substrate. The metal ions must diffuse through the diffusion boundary layer and into the TSV hole or other feature. A typical way to assist the diffusion is through convection flow of the electroplating solution provided by the pump 417. Additionally, a vibration agitation or sonic agitation member may be used as well as wafer rotation. For example, a vibration transducer 408 may be attached to the clamshell substrate holder 409.

The plating solution is continuously provided to plating bath 403 by the pump 417. Generally, the plating solution flows upwards through an anode membrane 415 and a diffuser plate 419 to the center of wafer 407 and then radially outward and across wafer 407. The plating solution also may be provided into the anodic region of the bath from the side of the plating bath 403. The plating solution then overflows plating bath 403 to an overflow reservoir 421. The plating solution is then filtered (not shown) and returned to pump 417 completing the recirculation of the plating solution. In certain configurations of the plating cell, a distinct electrolyte is circulated through the portion of the plating cell in which the anode is contained while mixing with the main plating solution is prevented using sparingly permeable membranes or ion selective membranes.

A reference electrode 431 is located on the outside of the plating bath 403 in a separate chamber 433, which chamber is replenished by overflow from the main plating bath 403. Alternatively, in some embodiments the reference electrode is positioned as close to the substrate surface as possible, and the reference electrode chamber is connected via a capillary tube or by another method, to the side of the wafer substrate or directly under the wafer substrate. Reference electrodes are commonly used in electroplating systems. In various electroplating systems, a negative potential is applied to a substrate/cathode to thereby electroplate metal onto the substrate. An anode (also referred to as a counter electrode) completes the primary circuit in the electroplating cell and receives a positive potential during plating. The anode counterbalances the reaction occurring at the substrate where metal is deposited. The reference electrode serves to provide a direct measure of the potential of the electrolyte at a particular location (the location of the reference electrode). A reference electrode draws negligible current and therefore does not create ohmic or mass transfer variations in the electrolyte close to the reference electrode. The reference electrode can be made to draw very little current by designing it to have a very high impedance. In some of the preferred embodiments, the apparatus further includes contact sense leads that connect to the wafer periphery and which are configured to sense the potential of the metal seed layer at the periphery of the wafer but do not carry any current to the wafer.

The reference electrode 431 is typically employed when electroplating at a controlled potential is desired. The reference electrode 431 may be one of a variety of commonly used types such as mercury/mercury sulfate, silver chloride, saturated calomel, or copper metal. A contact sense lead in direct contact with the wafer 407 may be used in some embodiments, in addition to the reference electrode, for more accurate potential measurement (not shown).

A DC power supply 435 can be used to control current flow to the wafer 407. The power supply 435 has a negative output lead 439 electrically connected to wafer 407 through one or more slip rings, brushes and contacts (not shown). The positive output lead 441 of power supply 435 is electrically connected to an anode 413 located in plating bath 403. The power supply 435, a reference electrode 431, and a contact sense lead (not shown) can be connected to a system controller 447, which allows, among other functions, modulation of current and potential provided to the elements of electroplating cell. For example, the controller may allow electroplating in potential-controlled and current-controlled regimes. The controller may include program instructions specifying current and voltage levels that need to be applied to various elements of the plating cell, as well as times at which these levels need to be changed. When forward current is applied, the power supply 435 biases the wafer 407 to have a negative potential relative to anode 413. This causes an electrical current to flow from anode 413 to the wafer 407, and an electrochemical reduction (e.g. $Cu^{2+}+2 e^-=Cu^0$) occurs on the wafer surface (the cathode), which results in the deposition of the electrically conductive layer (e.g. copper) on the surfaces of the wafer. An inert anode 414 may be installed below the wafer 407 within the plating bath 403 and separated from the wafer region by the membrane 415.

The apparatus may also include a heater 445 for maintaining the temperature of the plating solution at a specific level. The plating solution may be used to transfer the heat to the other elements of the plating bath. For example, when a wafer 407 is loaded into the plating bath the heater 445 and the pump 417 may be turned on to circulate the plating solution through the electroplating apparatus 401, until the temperature throughout the apparatus becomes substantially uniform. In one embodiment the heater is connected to the system controller 447. The system controller 447 may be connected to a thermocouple to receive feedback of the plating solution temperature within the electroplating apparatus and determine the need for additional heating.

The controller will typically include one or more memory devices and one or more processors. The processor may include a CPU or computer, analog and/or digital input/output connections, stepper motor controller boards, etc. In certain embodiments, the controller controls all of the activities of the electroplating apparatus. Non-transitory machine-readable media containing instructions for controlling process operations in accordance with the present embodiments may be coupled to the system controller.

Typically there will be a user interface associated with controller 447. The user interface may include a display screen, graphical software displays of the apparatus and/or process conditions, and user input devices such as pointing devices, keyboards, touch screens, microphones, etc. The computer program code for controlling electroplating processes can be written in any conventional computer readable programming language: for example, assembly language, C, C++, Pascal, Fortran or others. Compiled object code or script is executed by the processor to perform the tasks identified in the program. One example of a plating apparatus that may be used according to the embodiments herein is the Lam Research Sabre tool. Electrodeposition can be performed in components that form a larger electrodeposition apparatus.

Figure 5:
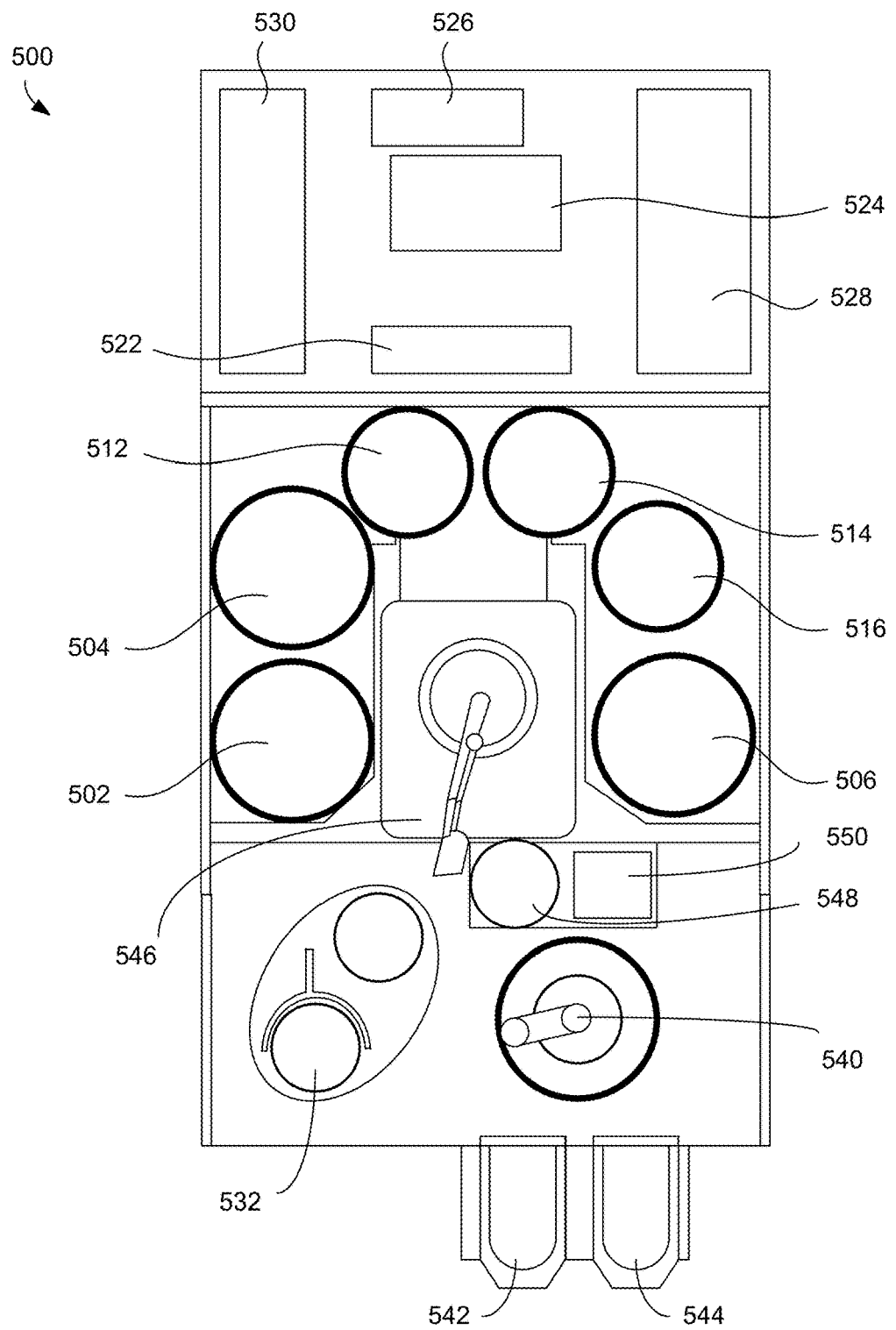
FIGS. 5 and 6 each illustrate an electroplating apparatus that includes a number of electroplating modules and other features.

FIG. 5 shows a schematic of a top view of an example electrodeposition apparatus. The electrodeposition apparatus 500 can include three separate electroplating modules 502, 504, and 506. The electrodeposition apparatus 500 can also include three separate modules 512, 514, and 516 configured for various process operations. For example, in some embodiments, one or more of modules 512, 514, and 516 may be a spin rinse drying (SRD) module. In other embodiments, one or more of the modules 512, 514, and 516 may be post-electrofill modules (PEMs), each configured to perform a function, such as edge bevel removal, backside etching, and acid cleaning of substrates after they have been processed by one of the electroplating modules 502, 504, and 506.

The electrodeposition apparatus 500 includes a central electrodeposition chamber 524. The central electrodeposition chamber 524 is a chamber that holds the chemical solution used as the electroplating solution in the electroplating modules 502, 504, and 506. The electrodeposition apparatus 500 also includes a dosing system 526 that may store and deliver additives for the electroplating solution. A chemical dilution module 522 may store and mix chemicals to be used as an etchant. A filtration and pumping unit 528 may filter the electroplating solution for the central electrodeposition chamber 524 and pump it to the electroplating modules.

A system controller 530 provides electronic and interface controls required to operate the electrodeposition apparatus 500. The system controller 530 (which may include one or more physical or logical controllers) controls some or all of the properties of the electroplating apparatus 500.

Signals for monitoring the process may be provided by analog and/or digital input connections of the system controller 530 from various process tool sensors. The signals for controlling the process may be output on the analog and digital output connections of the process tool. Non-limiting examples of process tool sensors that may be monitored include mass flow controllers, pressure sensors (such as manometers), thermocouples, optical position sensors, etc. Appropriately programmed feedback and control algorithms may be used with data from these sensors to maintain process conditions.

A hand-off tool 540 may select a substrate from a substrate cassette such as the cassette 542 or the cassette 544. The cassettes 542 or 544 may be front opening unified pods (FOUPs). A FOUP is an enclosure designed to hold substrates securely and safely in a controlled environment and to allow the substrates to be removed for processing or measurement by tools equipped with appropriate load ports and robotic handling systems. The hand-off tool 540 may hold the substrate using a vacuum attachment or some other attaching mechanism.

The hand-off tool 540 may interface with a wafer handling station 532, the cassettes 542 or 544, a transfer station 550, or an aligner 548. From the transfer station 550, a hand-off tool 546 may gain access to the substrate. The transfer station 550 may be a slot or a position from and to which hand-off tools 540 and 546 may pass substrates without going through the aligner 548. In some embodiments, however, to ensure that a substrate is properly aligned on the hand-off tool 546 for precision delivery to an electroplating module, the hand-off tool 546 may align the substrate with an aligner 548. The hand-off tool 546 may also deliver a substrate to one of the electroplating modules 502, 504, or 506 or to one of the three separate modules 512, 514, and 516 configured for various process operations.

An example of a process operation according to the methods described above may proceed as follows: (1) electrodeposit copper or another material onto a substrate in the electroplating module 504; (2) rinse and dry the substrate in SRD in module 512; and, (3) perform edge bevel removal in module 514.

An apparatus configured to allow efficient cycling of substrates through sequential plating, rinsing, drying, and PEM process operations may be useful for implementations for use in a manufacturing environment. To accomplish this, the module 512 can be configured as a spin rinse dryer and an edge bevel removal chamber. With such a module 512, the substrate would only need to be transported between the electroplating module 504 and the module 512 for the copper plating and EBR operations. In some embodiments the methods described herein will be implemented in a system which comprises an electroplating apparatus and a stepper.

Figure 6:
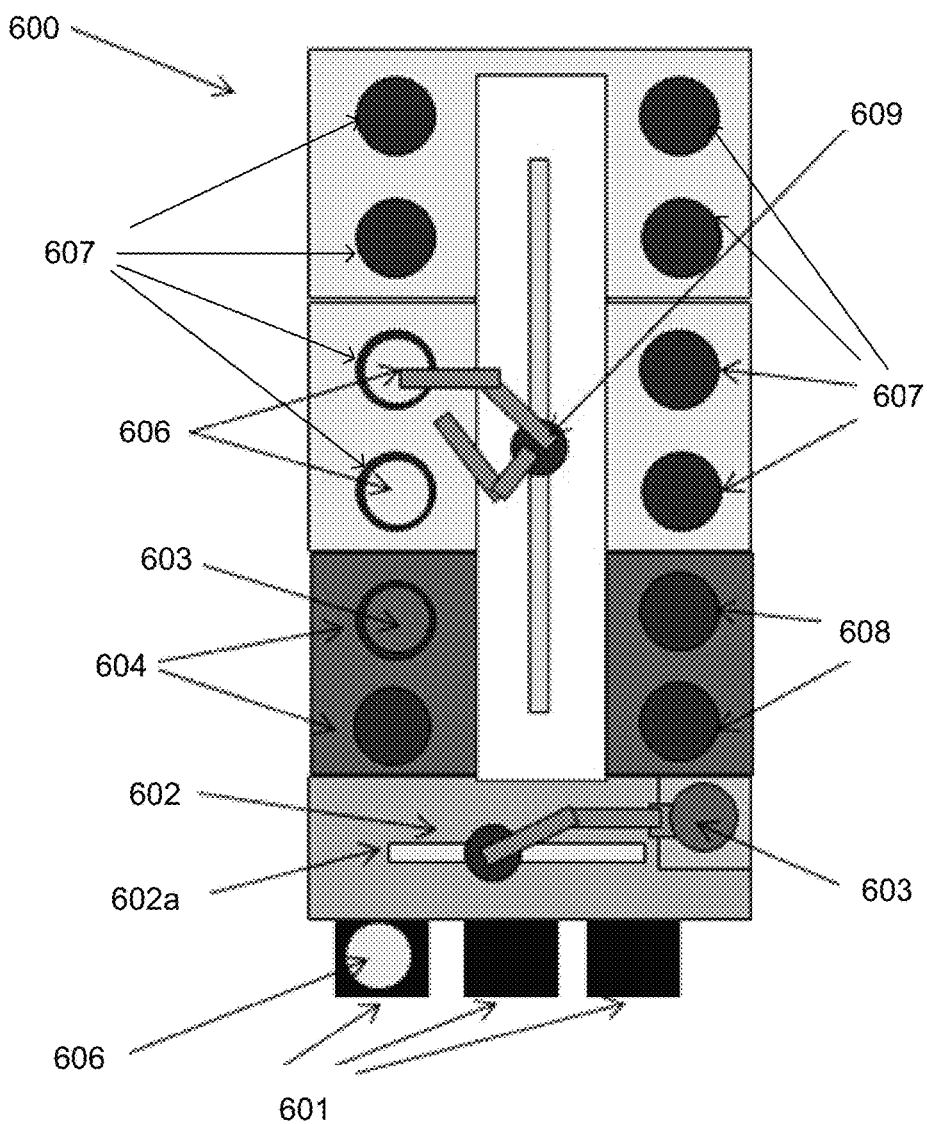

An alternative embodiment of an electrodeposition apparatus 600 is schematically illustrated in FIG. 6. In this embodiment, the electrodeposition apparatus 600 has a set of electroplating cells 607, each containing an electroplating bath, in a paired or multiple "duet" configuration. In addition to electroplating per se, the electrodeposition apparatus 600 may perform a variety of other electroplating related processes and sub-steps, such as spin-rinsing, spin-drying, metal and silicon wet etching, electroless deposition, pre-wetting and pre-chemical treating, reducing, annealing, photoresist stripping, and surface pre-activation, for example. The electrodeposition apparatus 600 is shown schematically looking top down in FIG. 6, and only a single level or "floor" is revealed in the figure, but it is to be readily understood by one having ordinary skill in the art that such an apparatus, e.g., the Novellus Sabre™ 3D tool, can have two or more levels "stacked" on top of each other, each potentially having identical or different types of processing stations.

Referring once again to FIG. 6, the substrates 606 that are to be electroplated are generally fed to the electrodeposition apparatus 600 through a front end loading FOUP 601 and, in this example, are brought from the FOUP to the main substrate processing area of the electrodeposition apparatus 600 via a front-end robot 602 that can retract and move a substrate 606 driven by a spindle 603 in multiple dimensions from one station to another of the accessible stations—two front-end accessible stations 604 and also two front-end accessible stations 608 are shown in this example. The front-end accessible stations 604 and 608 may include, for example, pre-treatment stations, and spin rinse drying (SRD) stations. Lateral movement from side-to-side of the front-end robot 602 is accomplished utilizing robot track 602a. Each of the substrates 606 may be held by a cup/cone assembly (not shown) driven by a spindle 603 connected to a motor (not shown), and the motor may be attached to a mounting bracket 609. Also shown in this example are the four "duets" of electroplating cells 607, for a total of eight electroplating cells 607. A system controller (not shown) may be coupled to the electrodeposition apparatus 600 to control some or all of the properties of the electrodeposition apparatus 600. The system controller may be programmed or otherwise configured to execute instructions according to processes described earlier herein.

System Controller

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The various hardware and method embodiments described above may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility.

Lithographic patterning of a film typically comprises some or all of the following steps, each step enabled with a number of possible tools: (1) application of photoresist on a workpiece, e.g., a substrate having a silicon nitride film formed thereon, using a spin-on or spray-on tool; (2) curing of photoresist using a hot plate or furnace or other suitable curing tool; (3) exposing the photoresist to visible or UV or x-ray light with a tool such as a wafer stepper; (4) developing the resist so as to selectively remove resist and thereby pattern it using a tool such as a wet bench or a spray developer; (5) transferring the resist pattern into an underlying film or workpiece by using a dry or plasma-assisted etching tool; and (6) removing the resist using a tool such as an RF or microwave plasma resist stripper. In some embodiments, an ashable hard mask layer (such as an amorphous carbon layer) and another suitable hard mask (such as an antireflective layer) may be deposited prior to applying the photoresist.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated may be performed in the sequence illustrated, in other sequences, in parallel, or in some cases omitted. Likewise, the order of the above described processes may be changed.

The subject matter of the present disclosure includes all novel and nonobvious combinations and sub-combinations of the various processes, systems and configurations, and other features, functions, acts, and/or properties disclosed herein, as well as any and all equivalents thereof.

EXPERIMENTAL

Figure 7A:
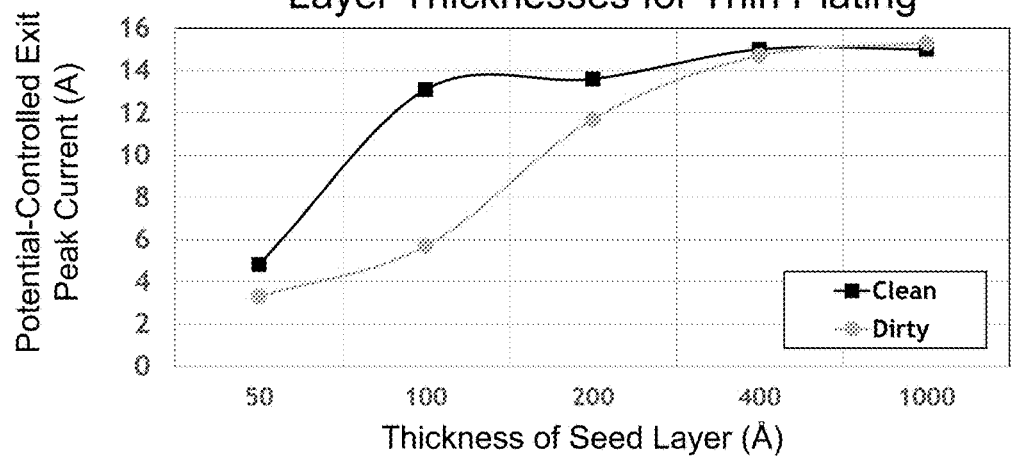
FIG. 7A is a graph illustrating the effect of substrate holder condition on the potential-controlled exit peak current for different seed layer thicknesses at a thin plating thickness.
Figure 7B:
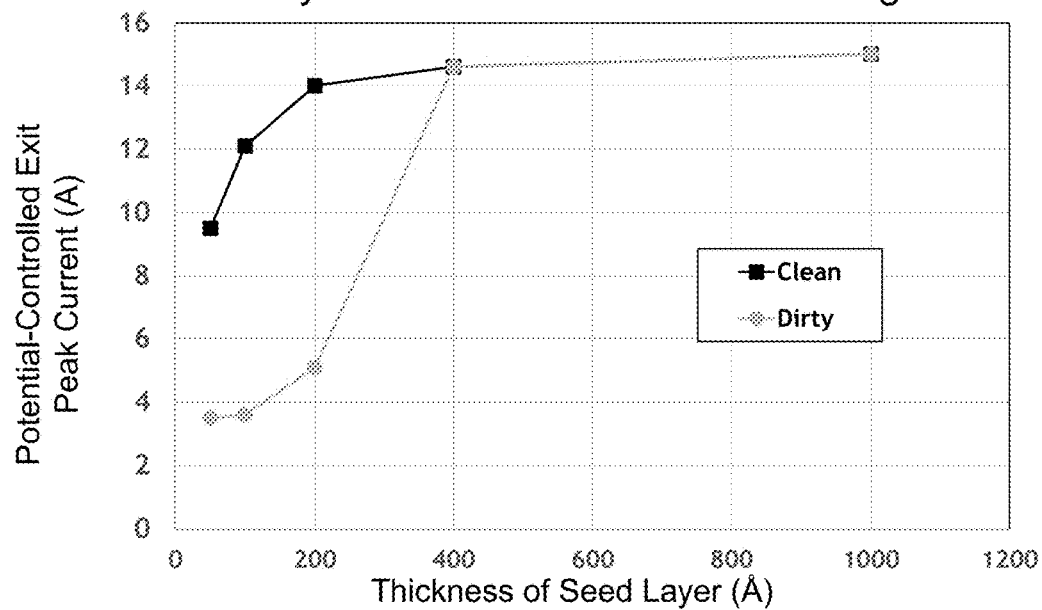
FIG. 7B is a graph illustrating the effect of substrate holder condition on the potential-controlled exit peak current for different seed layer thicknesses at a thick plating thickness.

FIGS. 7A and 7B present experimental results illustrating the effect of the substrate holder condition on the potential-controlled exit peak current for different seed layer thicknesses. Both the seed layers and the electroplated material in these examples were copper. FIG. 7A presents results related to electroplating a relatively thin film having a thickness of about 700 Å, while FIG. 7B presents results related to electroplating a relatively thicker film having a thickness of about 5000 Å. The substrate holder condition is referred to as either "clean" or "dirty." A clean substrate holder may also be referred to as "dry" while a dirty substrate holder may also be referred to as "crystal." As opposed to a clean substrate holder, a dirty substrate holder is one that has dried-on electrolyte or other unwanted material that affects the efficiency at which current/potential is applied to the substrate through the substrate holder. In this example, the electroplating process is operating within its pre-defined processing window when the substrate holder is clean, and outside of its pre-defined processing window when the substrate holder is dirty. Thus, generally speaking, the expected range for the potential-controlled exit peak current corresponds with the data related to the clean substrate holder.

As shown in both FIGS. 7A and 7B, the potential-controlled exit peak current is sensitive to the condition of the substrate holder for seed layer thicknesses of about 400 Å or less. Above this seed layer thickness, the differences were minimal between the clean and dirty conditions. Advantageously, the potential-controlled exit peak current was sensitive to the condition of the substrate holder for both thin electroplated films (FIG. 7A, 700 Å film) and thick electroplated films (FIG. 7B, 5000 Å film). These results suggest that the potential-controlled exit peak current can be monitored to effectively identify/flag cases where the substrate holder is dirty and should be cleaned or replaced before further processing on additional substrates.

To obtain the potential-controlled exit peak currents shown in FIGS. 7A and 7B, a constant potential of about 100-5000 millivolts was applied between the substrate and the reference electrode positioned in the electrolyte. This constant potential was applied for a duration of about 20 milliseconds while the substrate was being removed from the electrolyte, after the film was substantially plated. During application of this constant potential, the current delivered to the substrate was monitored and recorded. The potential-controlled exit peak current relates to the maximum current delivered to the substrate during the potential-controlled (in this case potentiostatic) exit step. The experiment was repeated for a number of different substrates having different seed thicknesses.

With reference to FIG. 7B, in one example a 200 Å seed layer is used. Under normal operation (e.g., when the electroplating process is running within a particular pre-defined processing window), it is expected that the potential-controlled exit peak current will fall between about 13-15 A. If the potential-controlled exit peak current is outside of this expected range, it can be determined that the electroplating process is no longer running within the pre-defined processing window. For instance, where the substrate holder is dirty, the potential-controlled exit peak current may be about 5 A, as shown in FIG. 7B. In response to this out-of-specification potential-controlled exit peak current, some corrective action may be taken, as described in relation to operation 113 of FIGS. 1 and 3. In some cases, the corrective action may involve further metrology to diagnose the problem, as discussed above. In a particular example, the corrective action may involve inspecting and then cleaning or replacing the substrate holder.

FIGS. 7A and 7B suggest that the methods described herein are useful for identifying cases in which the substrate holder is in poor condition for electroplating, at least up to a particular seed thickness. At seed thicknesses above about 400 Å, the potential-controlled exit peak current does not appear to be sensitive to the condition of the substrate holder. However, it is expected that the methods described herein will be useful even at greater seed thicknesses in cases where higher resistance seed layer materials are used. As mentioned above, the seed layers used in relation to FIGS. 7A and 7B were copper. In cases where a cobalt seed layer is used (or any metal seed layer material having a similar or higher resistance compared to cobalt), it is expected that the described methods will be sensitive to the condition of the substrate holder even at seed layer thicknesses above 400 Å. In various embodiments, the seed layer may have a sheet resistance between about 0.1-200 ohm/sq. The potential-controlled exit peak current may be sensitive to conditions that cause the electroplating process to run outside of its pre-defined process window when the substrate is provided with a seed layer having this sheet resistance.

Figure 7C:
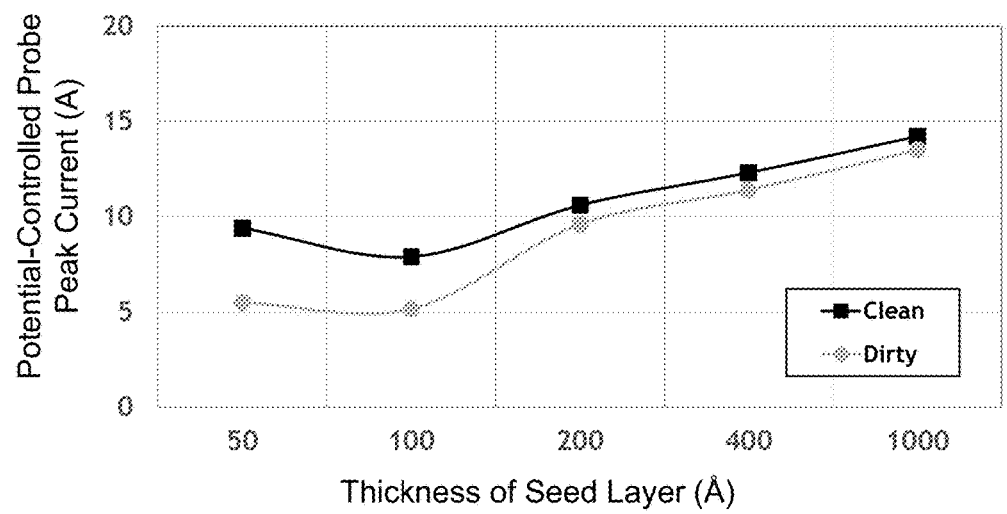
FIG. 7C is a graph illustrating the effect of substrate holder condition on the potential-controlled probe peak current for different seed layer thicknesses, where the potential-controlled probe occurs during immersion.

FIG. 7C is a graph illustrating the effect of substrate holder condition on the potential-controlled probe peak current for different seed layer thicknesses. In this example, the potential-controlled probe operation occurred while the substrate was being immersed, and it involved applying a constant potential of about 1000 millivolts between the substrate and the reference electrode. In other words, a potentiostatic entry was used, as described above. The constant potential was applied to the substrate for a duration of about 0.1 s, from a time before the substrate started entering the solution, until a time after the substrate was fully immersed. During application of the constant potential, the current delivered to the substrate was monitored and recorded. The y-axis refers to the maximum current delivered to the substrate during application of the constant potential during the probe step (in this case during immersion). The experiment was carried out on a number of substrates having different seed layer thicknesses.

The data show that the potential-controlled probe peak current is sensitive to the condition of the substrate holder. Generally, in cases where the substrate holder is dirty (e.g., with dried-on electrolyte), the potential-controlled probe peak current is lower than expected. In some other cases, a substrate holder with a different unwanted material thereon may result in a potential-controlled probe peak current that is higher than expected. Like the data in FIGS. 7A and 7B, the expected value/range of the potential-controlled peak current corresponds with the data produced when the substrate holder was clean.

Figure 8:
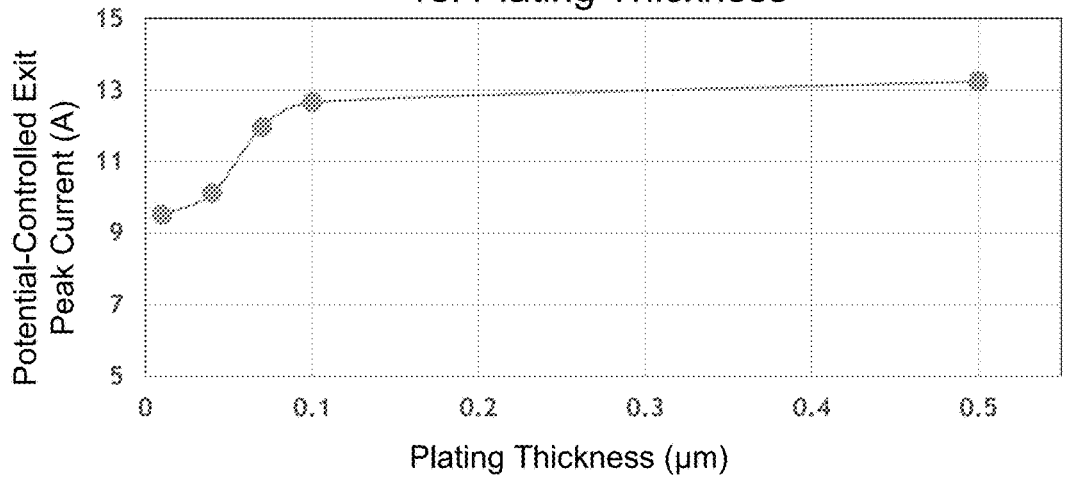
FIG. 8 is a graph depicting the potential-controlled exit peak current vs. plating thickness for certain copper films.

FIG. 8 presents a graph illustrating the potential-controlled exit peak current vs. electroplated film thickness for substrates provided with 50 Å copper seed layers. In this example, the controlled potential applied to the substrate was a constant potential of about 1000 millivolts between the substrate and the reference electrode. The constant potential was applied to the substrate for a duration of about 20 milliseconds as the substrate was being removed from the electrolyte. The results show that the potential-controlled exit peak current is sensitive to the plated film thickness up to about 0.1 μm. At film thicknesses above about 0.1 μm, the potential-controlled exit peak current is much less sensitive to the plated film thickness. The results in FIG. 8 suggest that the potential-controlled exit peak current can be used to identify/flag cases where the electroplated film thickness is greater or less than expected. The potential-controlled exit peak current is especially sensitive in this regard if the electroplated film (either the desired film or the actual plated film) has a thickness of about 0.1 μm or less.

In one example, the electroplating process is designed to produce a plated film about 0.15 μm thick, resulting in an expected potential-controlled exit peak current between about 12.5-13.5 Å, as shown in FIG. 8. Where the electroplating process is running out-of-specification and a film only about 0.5 μm thick is formed, the potential-controlled exit peak current may be about 11 A, as shown in FIG. 8. The potential-controlled exit peak current in this example is outside of its expected range, indicating that there is a problem with the electroplating process or apparatus that should be addressed before processing additional substrates.

Figure 9:
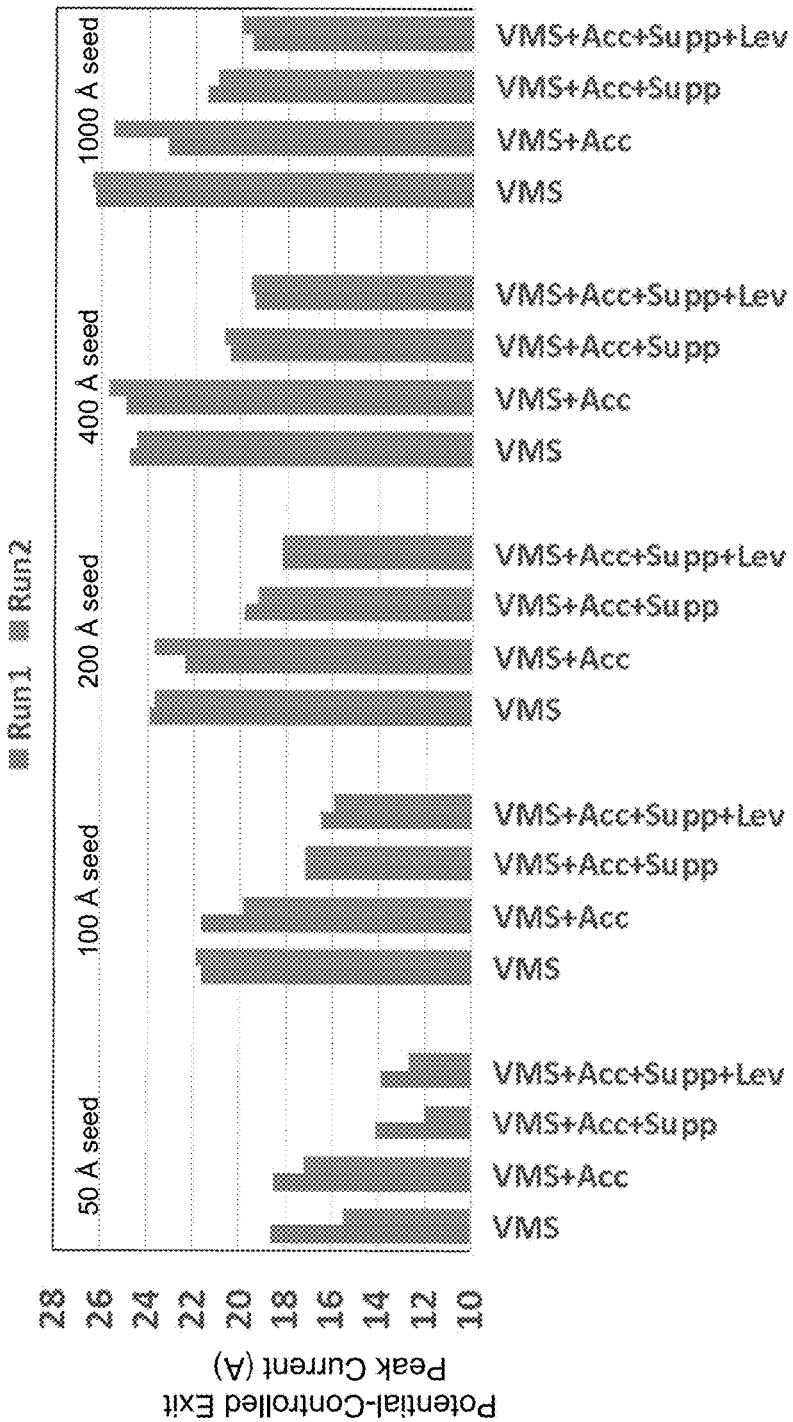
FIG. 9 is a graph showing the potential-controlled exit peak current for several different electrolytes and seed thicknesses.

FIG. 9 provides a graph depicting the potential-controlled exit peak current for different electrolytes and different seed layer thicknesses. Four different electrolytes were tested at five different seed thicknesses, and two runs were performed for each combination of seed thickness/electrolyte composition. The different electrolytes were (A) VMS (virgin makeup solution, which includes $CuSO_4$, HCl, $H_2SO_4$, and deionized water, each at a standard concentration); (B) solution A plus 6 ml/l MLI accelerator; (C) solution B plus 8 ml/l MLI suppressor; and (D) solution C plus 3 ml/l MLI leveler. Results related to thinner seed layers are presented toward the left side of the graph, and results related to thicker seed layers are presented toward the right side of the graph. For each seed thickness, the potential-controlled exit peak current was sensitive to the composition of the electrolyte. These results suggest that the disclosed methods can be used to identify/flag cases where the electrolyte is out-of-specification. Advantageously, this flagging can prevent further substrates from being processed in electrolyte that does not have the proper concentration of organic plating additives. This minimizes the waste/cost associated with sub-standard or failed electroplating results.

What is claimed is:

1. A method of monitoring an electroplating process, the method comprising:
    (a) immersing a substrate in an electrolyte, the substrate comprising recessed features;
    (b) electroplating metal into the recessed features on the substrate;
    (c) after the recessed features are substantially filled with metal, monitoring a current delivered to the substrate while applying a controlled potential between the substrate and a reference electrode positioned in the electrolyte;
    (d) determining a potential-controlled exit peak current that corresponds to a maximum value of the current delivered to the substrate during application of the controlled potential during (c); and
    (e) comparing the potential-controlled exit peak current to an expected range for the potential-controlled exit peak current.

2. The method of claim 1, wherein (c) occurs while the substrate is being removed from the electrolyte.

3. The method of claim 1, wherein the controlled potential applied to the substrate during (c) is a constant potential.

4. The method of claim 1, further comprising:
    (f) in response to a determination that the potential-controlled exit peak current is outside of the expected range for the potential-controlled exit peak current, inspecting an apparatus used to electroplate on the substrate.

5. The method of claim 4, wherein inspecting the apparatus used to electroplate on the substrate comprises inspecting a substrate holder and/or an anode.

6. The method of claim 4, further comprising cleaning and/or replacing a substrate holder and/or anode in the apparatus used to electroplate on the substrate.

7. The method of claim 1, further comprising:
    (f) in response to a determination that the potential-controlled exit peak current is outside of the expected range for the potential-controlled exit peak current, either (i) analyzing the electrolyte, (ii) refreshing the electrolyte, or (iii) replacing the electrolyte.

8. The method of claim 1, further comprising:
    (f) in response to a determination that the potential-controlled exit peak current is within the expected range for the potential-controlled exit peak current, providing a second substrate and electroplating on the second substrate.

9. The method of claim 1, wherein during (c), the controlled potential is applied between the substrate and the reference electrode for a duration between about 5-100 milliseconds.

10. The method of claim 1, wherein during (c), the controlled potential applied between the substrate and the reference electrode has a magnitude between about 5-500 millivolts.

11. The method of claim 1, further comprising during (a), applying a second controlled potential to the substrate, monitoring a current delivered to the substrate during application of the second controlled potential, determining a potential-controlled entry peak current that corresponds to a maximum value of the current delivered to the substrate during application of the second controlled potential during (a), and comparing the potential-controlled entry peak current to an expected range for the potential-controlled entry peak current.

12. The method of claim 1, further comprising during (b) before the features are substantially filled, applying a second controlled potential to the substrate, monitoring a current delivered to the substrate during application of the second controlled potential, determining a potential-controlled probe peak current that corresponds to a maximum value of the current delivered to the substrate during application of the second controlled potential during (b), and comparing the potential-controlled probe peak current to an expected range for the potential-controlled probe peak current.

13. The method of claim 1, wherein electroplating in (b) comprises at least a first stage and a second stage, wherein during the first stage, a first constant current is applied to the substrate, and during the second stage, a second constant current is applied to the substrate, the first current and second current being different from one another.

14. The method of claim 1, wherein the substrate is provided with a seed layer having a sheet resistance between about 0.1-200 ohm/sq.

15. The method of claim 1, further comprising monitoring a potential between the substrate and an anode during (a), (b), and/or (c).

16. The method of claim 1, further comprising monitoring a potential between the reference electrode and an anode during (a), (b), and/or (c).

17. The method of claim 1, wherein immersing the substrate in (a) comprises:
    (i) applying a second controlled potential between the substrate and the reference electrode and monitoring a current delivered to the substrate during application of the second controlled potential,
    (ii) when the current delivered to the substrate during application of the second controlled potential reaches a threshold current, ceasing application of the second controlled potential and applying a current to the substrate, wherein the current applied to the substrate during (ii) changes as the substrate is immersed to thereby provide a uniform current density to an immersed portion of the substrate.

18. The method of claim 1, further comprising:

determining a potential-controlled exit average current that corresponds to an average value of the current delivered to the substrate during application of the controlled potential during (c); and comparing the potential-controlled exit average current to an expected range for the potential-controlled exit average current.

* * * * *